United States Patent [19]

Mitchell, Jr.

[11] Patent Number: 4,703,984
[45] Date of Patent: * Nov. 3, 1987

[54] FLEXIBLE ACCESS CONNECTOR WITH MINIATURE SLOTTED PADS

[75] Inventor: John W. Mitchell, Jr., Pasadena, Calif.

[73] Assignee: Burroughs Corporation, Detroit, Mich.

[ * ] Notice: The portion of the term of this patent subsequent to Jun. 30, 2004 has been disclaimed.

[21] Appl. No.: 791,957

[22] Filed: Oct. 28, 1985

[51] Int. Cl.$^4$ .............................................. H01R 9/09
[52] U.S. Cl. ...................................... 439/70; 361/398; 439/712
[58] Field of Search .............. 339/17 F, 17 E, 17 CF, 339/150 B, 151 B; 361/398; 324/73 PC

[56] References Cited

U.S. PATENT DOCUMENTS

| | | |
|---|---|---|
| 3,530,229 | 9/1970 | Burke, Jr. .......................... 339/17 F |
| 3,989,338 | 11/1976 | Gosser .............................. 339/113 R |
| 4,121,044 | 10/1978 | Hadersbeck et al. ............... 361/398 |
| 4,435,740 | 3/1984 | Huckabee et al. .................. 361/398 |

FOREIGN PATENT DOCUMENTS 1188520  4/1970  United Kingdom ............. 339/17 F

OTHER PUBLICATIONS

IBM Bulletin, Roche, vol. 6, No. 8, p. 87, 1–1964.

Primary Examiner—Neil Abrams
Attorney, Agent, or Firm—Alfred W. Kozak; Nathan Cass

[57] ABSTRACT

A flexible thin film provides interior miniature conducting contact pads which mesh with the extension pins of a pin grid array to establish a tensioned reliable electrical contact. These contacts each connect to an exterior point which is available for probing even while the pin grid array is inserted in a printed circuit board.

8 Claims, 8 Drawing Figures

FIG. 2. Access Device Unit.

FIG. 4A. Typical Interior Pad.
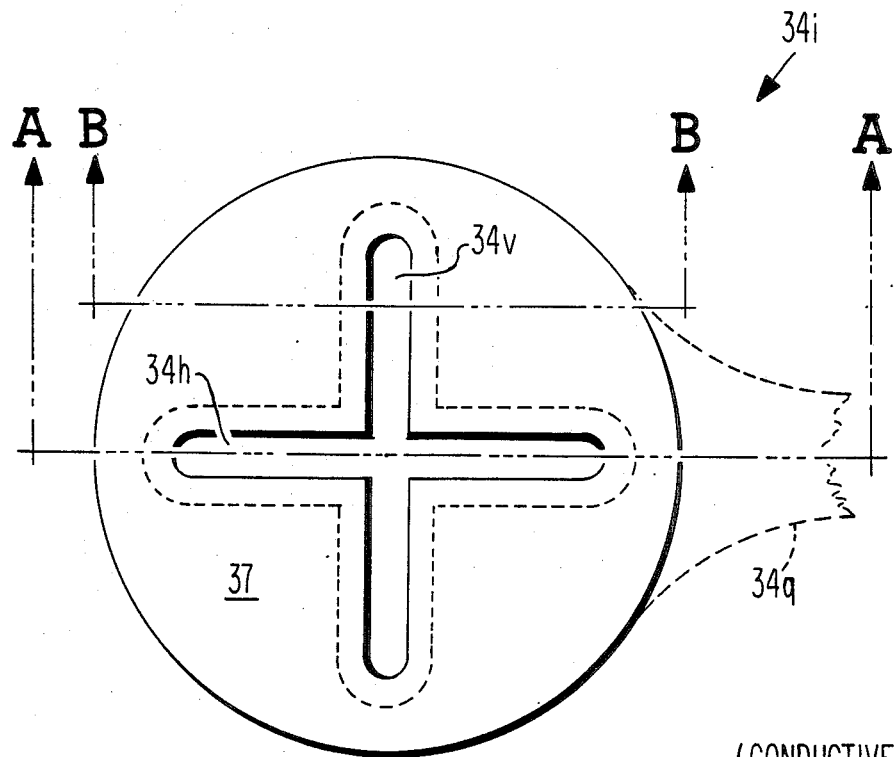
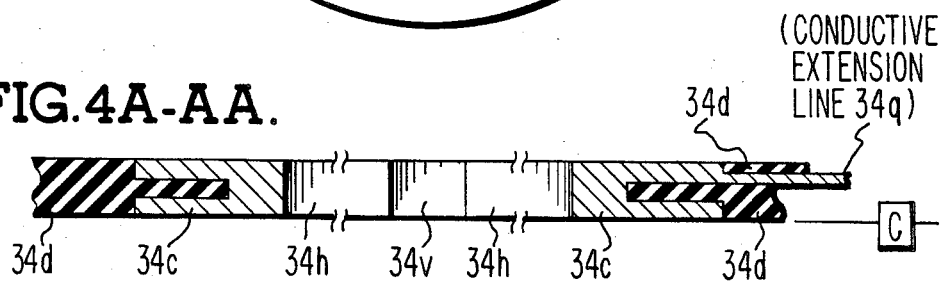
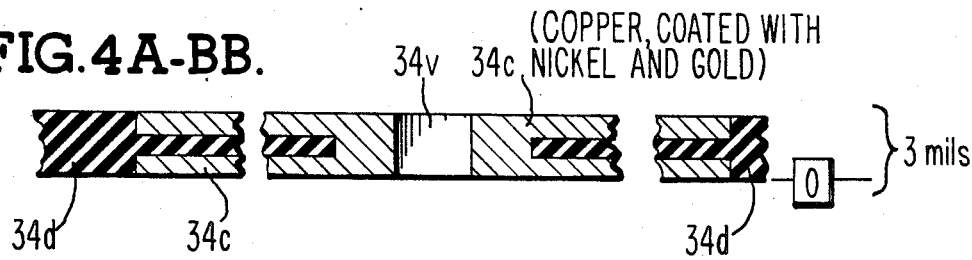

FIG.4B. Typical Perimeter Pad (Exterior).
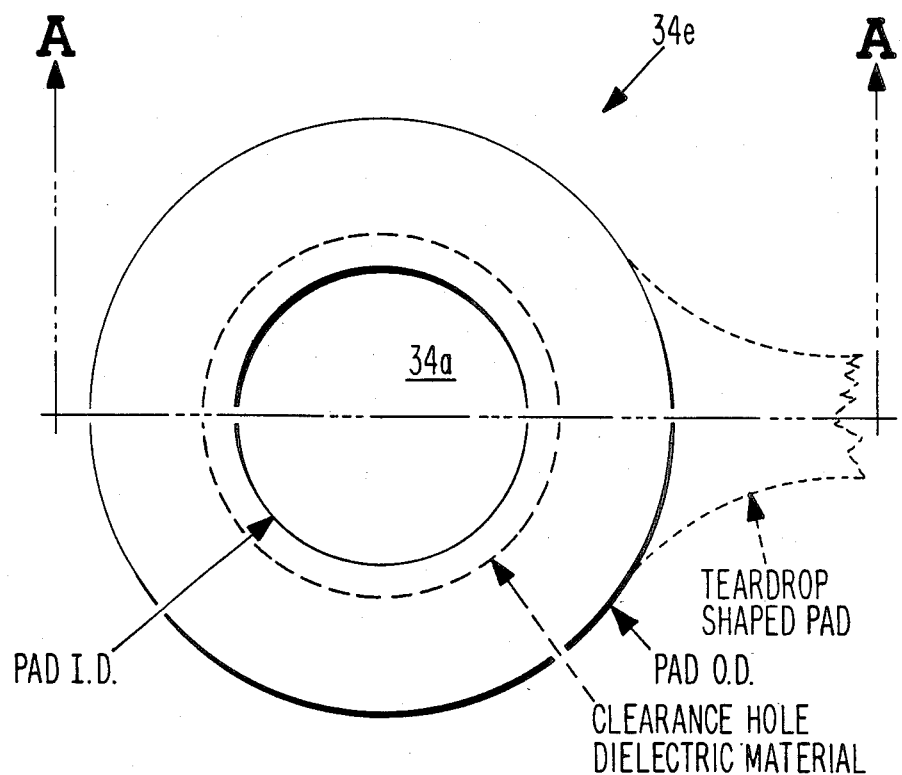
FIG.4B-AA.
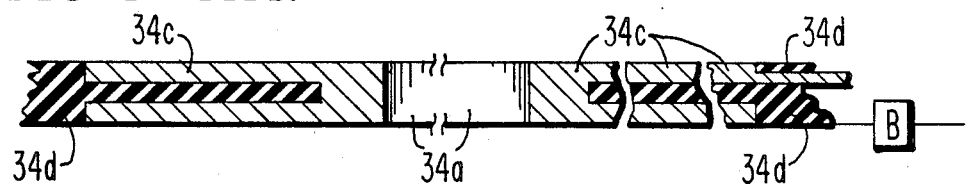

FLEXIBLE ACCESS CONNECTOR WITH MINIATURE SLOTTED PADS

CROSS REFERENCES TO RELATED APPLICATIONS

This disclosure is related to a co-pending application U.S. Ser. No. 791,958, filed Oct. 28, 1985 by inventor John W. Mitchell, Jr. and entitled "Access Device Unit for Installed Pin Grid Array".

FIELD OF THE INVENTION

This disclosure pertains to the field of printed circuit boards and the components residing thereon for purposes of providing apparatus to enable electrical accessibility for testing points of an inserted pin grid array unit.

BACKGROUND OF THE INVENTION

Modern circuit technology involves the primary usage of printed circuit boards upon which multiple components are mounted. One of the major uses of printed circuit boards is for the mounting of pin grid array units which provide an integrated circuit having multitudinous connections which are output through connector pins on the underside. These pin grid arrays are mounted via the underside pins onto a printed circuit board and soldered (or inserted in sockets placed in the circuit board) into place in such a close knit fashion that it is underside pins once they are mounted on the printed circuit board.

It is very desirable and sometimes essential that there be methods of probing the pins of a pin grid array that is soldered or attached to a circuit board. One method for accessing the pins of the pin grid array is to access them from the solder side of the board. However, as obvious as this may seem, this method of access is not feasible due to the situation where the solder side is not accessible for probing due to proximity of other printed circuit boards and also the difficulty in locating and spotting specific pin locations in a relatively inaccessible area.

Another method of probing the pins of a pin grid array is to use what are known as "scratch pads" on the top surface of the pin grid array. However, again there are disadvantages and problems involved in this method, since "scratch pads" for probing may have to be built into the pin grid array by the manufacturer at additional expense. In this situation, each scratch pad is etched on the top of the pin grid array and is connected to a corresponding pin via internal interconnections. This adds considerable expense to the pin grid array unit. And again unfortunately, in actual usage, the top surface of a pin grid array must very often be used to mount a heat sink which thenmakes access to the added scratch pads an impossibility.

In order to solve these various problems of pin probe accessibility in an economic and efficient manner, the present disclosure presents an access device unit printed on a flexible film circuit. This device is inserted between the printed circuit board and the pin grid array. Thereafter any inaccessible pin can be accessed by attaching a probe to the appropriate perimeter (external) contact pad on the flexible circuit which provides electrical connection to the underside pins of the pin grid array.

SUMMARY OF THE INVENTION

In order to provide probe accessibility to any one of a multiple number of pins of a pin grid array, the present disclosure provides for a small flexible polyimide film which has circuit connections from the underside of each pin of the pin grid array over to external flaps which have corresponding contact points into which a probe may be inserted to make electrical contact.

The flexible film circuit provides a series of interior contact pads which correlate with and match the locations of each pin of the pin grid array. Each of these interior contact pads is connected electrically by a thin film circuit line to a corresponding exterior contact pad on which are located external flexible flaps along the side edges of the pin grid array. These external contact pads are identified by a row and column so that each external contact pad can be correlated to each individual "internal" contact pad. Each contact pad is "symmetrical" in that a conductive layer sits on both sides of each contact pad thus enabling pin insertion from either side.

Each of the interior contact pads are made with central slotted apertures which are placed at right angles to each other so that insertion of the pin probe from the pin grid array will penetrate the interior contact pad while at the same time providing for a tensioned pressure against the pin too make a suitable electrical contact.

BRIEF DESCRIPTION OF THE DRAWINGS

FIG. 4A is a top plan view of the "interior" contact pad illustrating the slotted apertures which run vertical and horizontal, together with a set of two cross-sectional views;

FIG. 4B shows a top plan view of the "exterior" contact pad and one cross-sectional view.

DESCRIPTION OF THE PREFERRED EMBODIMENT

Figure 1:
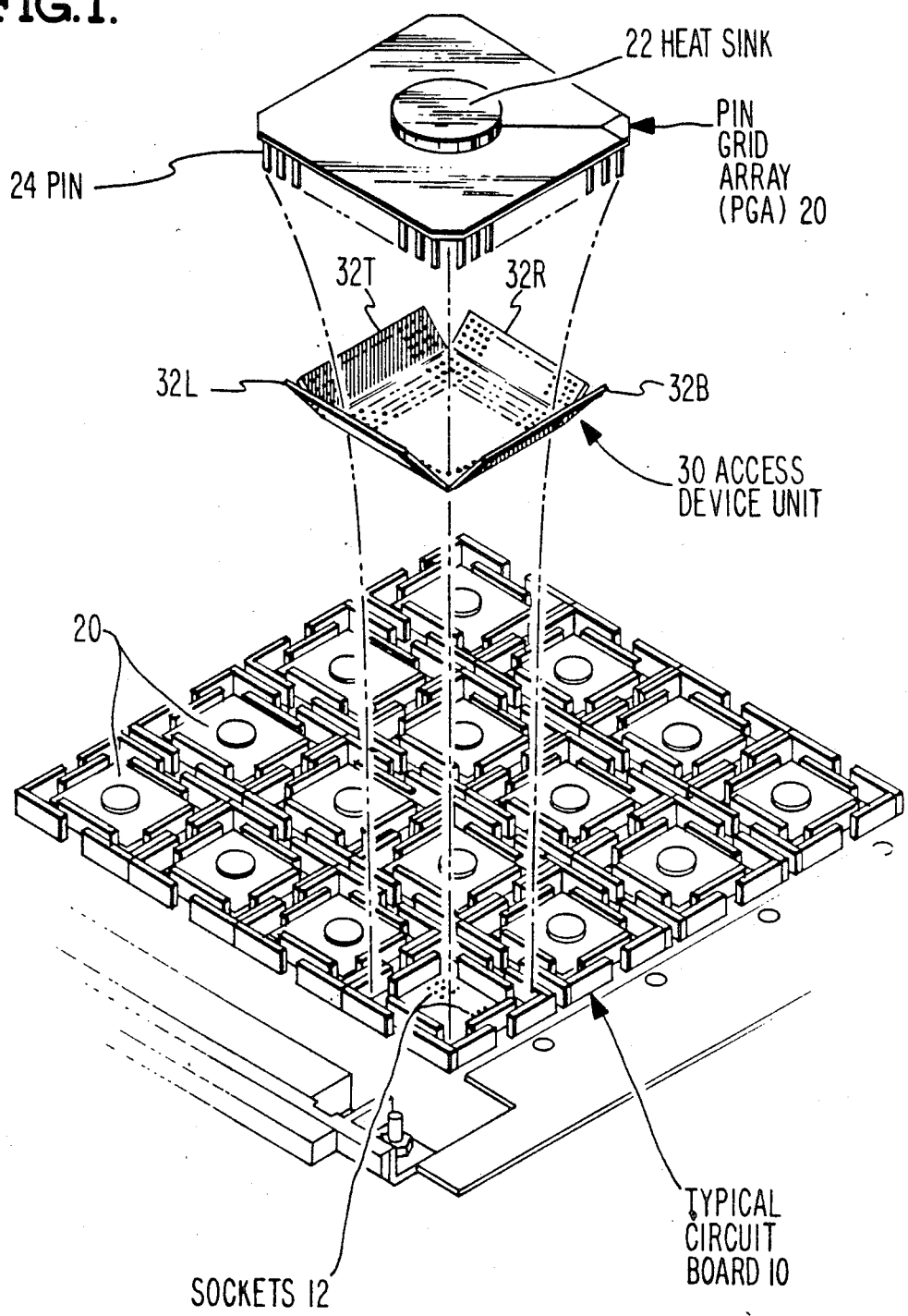
FIG. 1 illustrates in an exploded view the situation whereby a typical printed circuit board which is used to mount pin grid arrays may have an access device unit placed under the pin grid array.

Referring to FIG. 1, there is seen a typical circuit board 10 in which various areas of real estate have been allocated for the insertion of pin grid arrays such as pin grid array 20. In typical usage, the pin grid array 20 willoften have a heat sink device 22 to permit heat dissipation for the array unit. Very often the heat sink will be much larger and cumbersome than that shown in the drawing of FIG. 1. In any case the heat sink will preclude the use of a top surfaced "scratch pad".

As further seen in FIG. 1, the printed circuit board 10 will have sockets 12 soldered to the board as shown, in order to receive the pins 24 which can be inserted into the apertures of the sockets 12.

The access device unit 30 shown in FIG. 1 is mounted underneath the pin grid array 20 so that it will rest between the circuit board land area and the pin grid array itself. However, each of the pins 24 of the pin grid array 20 can penetrate through the "interior" contact pads ($34_i$ of FIG. 2) and thence penetrate the apertures of the sockets 12 to make contact with the underside of the printed circuit board as seen in FIG. 3.

Figure 2:
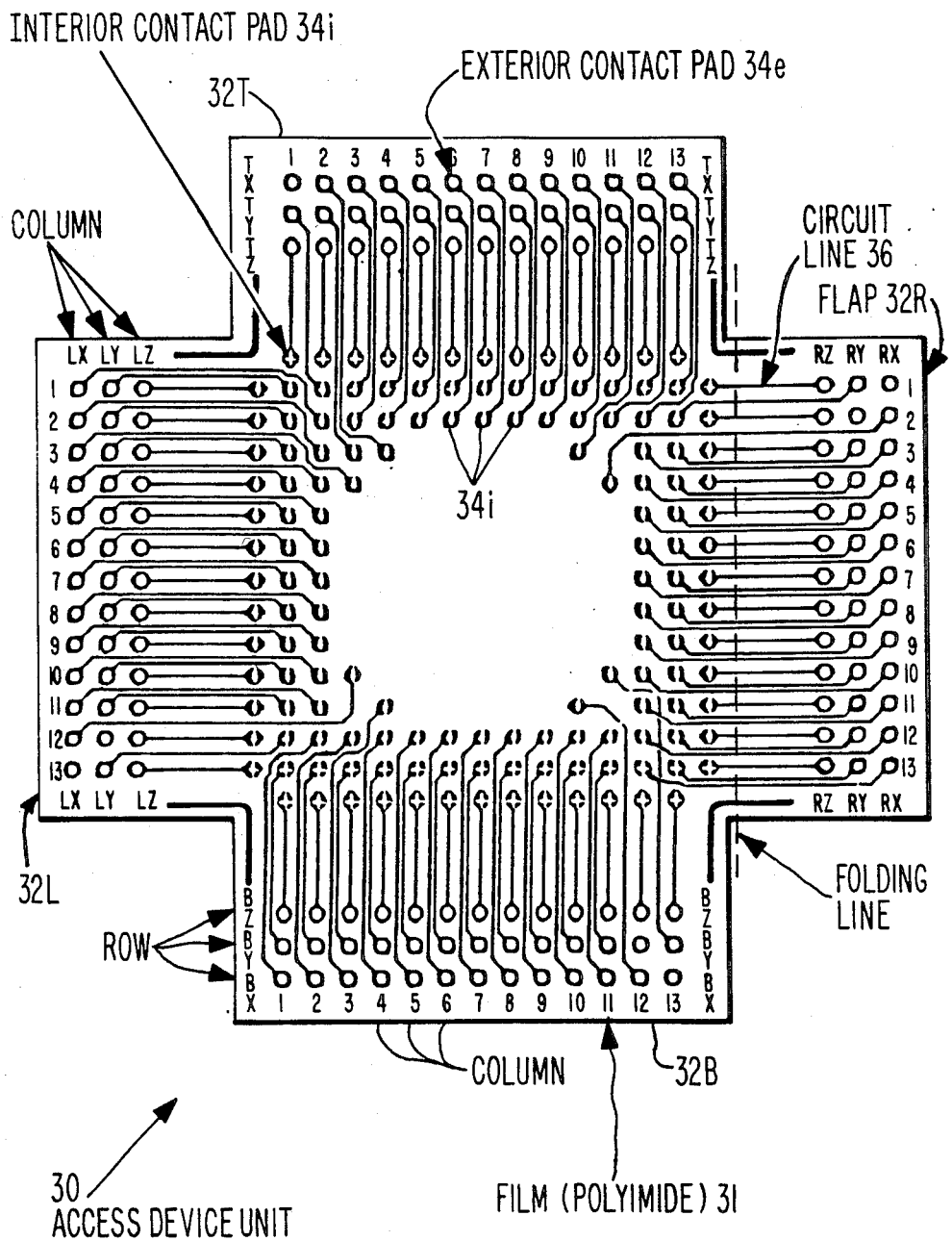
FIG. 2 is a blown-up illustration of the access device unit which is provided by a thin film of plastic such as polyimide.
Figure 3:
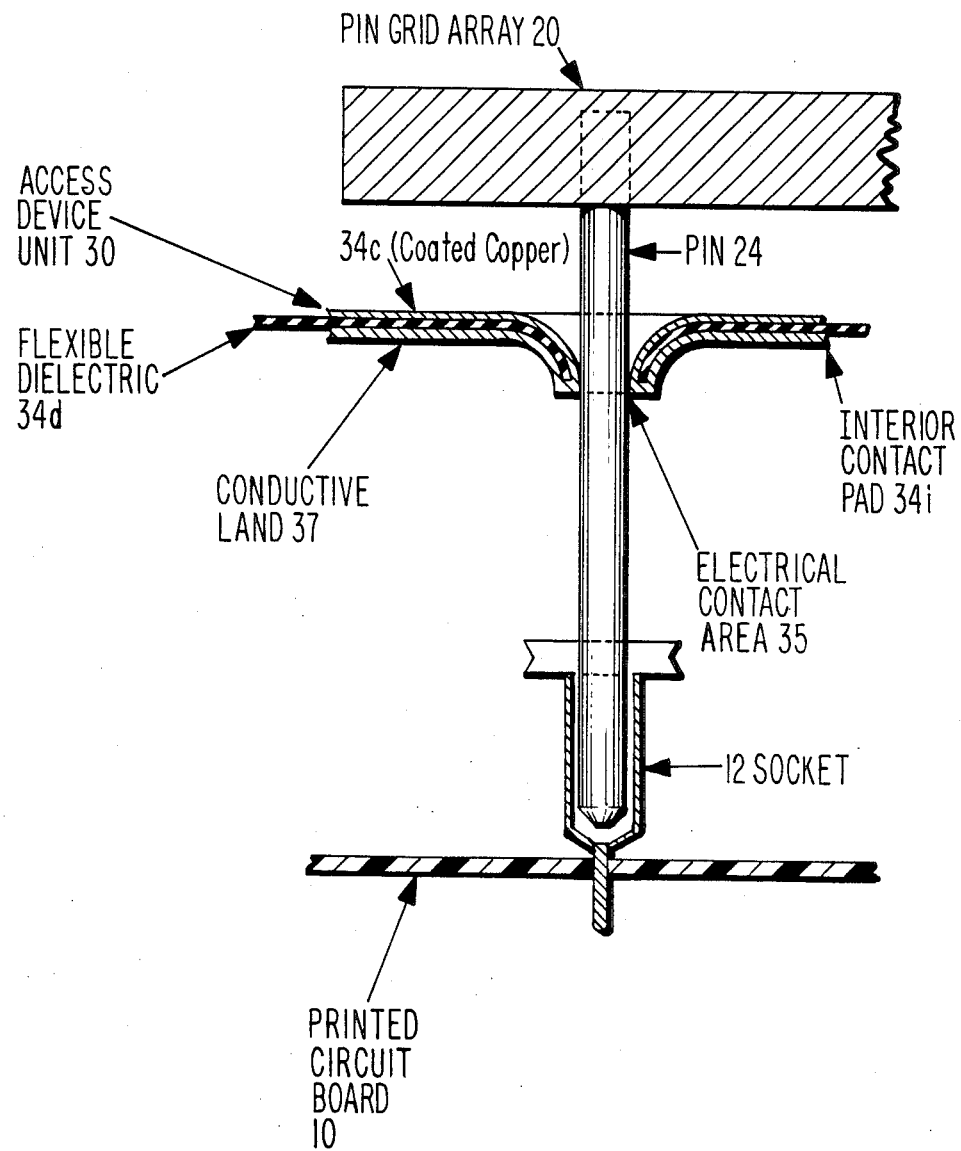
FIG. 3 is a cross-sectional view of a single pin of a pin grid array as it is used to penetrate the interior contact pad.

FIG. 2 illustrates an expanded layout of the access device unit 30 of FIG. 1. The access device unit 30 is a flexible film circuit made up of alternating layers of polyimide film which uses copper, nickel and gold to provide the "interior" contact pads $34_i$ and the "exterior" (perimeter) contact pads $34_e$.

The polyimide film is known under the tradename of Kapton as produced and manufactured by E. I. DuPont and DeNemours and Company of 1007 Market St., Wilmington, DE 19898. This film has an approximate thickness of 5 mils plus or minus 2 mils. This figure in inches would be designated as 0.005 inches or 5/1000ths of an inch plus or minus 2/1000ths of an inch tolerance.

In FIG. 2 the polyimide film 31 is shown supporting a series of exterior contact pads $34_3$ and an interior set of contact pads $34_i$. The set of interior contact pads $34_i$ are patterned to form a set of locations which correlate with the pins 24 of the pin grid array 20. Thus, when the pin grid array 20 is inserted into the sockets (12) mounted on the printed circuit board each pin of the pin grid array will contact and correlate to a specific interior contact pad of the access device unit.

As seen in FIG. 2, each of the interior contact pads $34_i$ is connected by a circuit line 36 onto an exterior contact pad $34_e$. The exterior contct pads $34_e$ will be seen to reside on a set of four flaps designated as flap 32R, flap 32T, flap 32L, and flap 32B.

These flaps are easily flexed upward in order to make them easily available for probing any given contact pad with an exterior probe unit. This can be seen in FIG. 1 where the access device unit 30 is shown with the flexible flaps bent upward for easy access with a probe.

As will be noted in FIG. 2, each flap is identified according to row and column designations so that it can be easily seen and accessed with a probe unit in order to make contact with any given pin on the underside of the pin grid array. Thus referring, for example, to flap 32L, it will be seen that there are three columns designated as LX, LY and LZ. Each of these columns can further be identified by a series of row numbers which go from row 1 through row 13. Similarly the flap 32R has columns designated RZ, RY and RX together with rows 1 through 13. The flap 32T is shown as having rows TX, TY and TZ and columns 1 through 13 which is similar to flap 32B which has rows BZ, BY and BX, together with columns 1 through 13.

FIG. 3 illustrates how an underside pin 24 of pin grid array 20 is connected to the printed circuit board 10 through a socket 12. The access device unit 30 is placed to reside under the pin grid array 20 and thus permits the exterior contact pads $34_e$ (FIG. 2) to be accessible for electrical probes.

In FIG. 3 the "interior" contact pad $34_i$ is seen being able to "flex" against the pin 24 to establish a contact area 35 with a pressured spring force. This pressured spring force is accomplished by specialized conductive lands 37 which are formed of a metal laminate. As seen in FIG. 3, this metal laminate involves a central layer of flexible dielectric (such as the mentioned Kapton) which is covered by a plated copper layer as described in connection with FIGS. 4A and 4B. Basically the metal laminate is a sandwich of a polyimide central layer covered over and under by a copper layer which is plated over with a nickel layer and a gold layer.

Referring to FIG. 4A, there is shown a top plan view of the interior contact pad $34_i$. This "interior" contact pad $34_i$ must be contrasted with the "exterior" contact pad $34_e$. The exterior contact pad $34_e$ (FIG. 4B) is a metallic ring with a relatively large circular internal aperture $34_a$ as can be also seen in FIG. 2. On the other hand, as seen in FIG. 2 and particularly in FIG. 4A, the interior contact pad $34_i$ has a large land area 37 which has two slotted apertures. These apertures may preferably be at right angles to each other such as shown at $34_v$ and at $34_h$ which show a vertical slotted aperture and a horizontal slotted aperture. Other geometric forms of aperture may also be provided in the contact pad design if they provide a comparably solid and resilient electrical contact area.

The conductive resilient land area 37 of FIG. 4A (and FIG. 3) is seen in more detail in the cross-sections designated A—A and B—B. Here the copper conductor $34_c$ provides a sandwich over the dielectric $34_d$ which preferably is formed of the mentioned Kapton polyimide. The copper layer is preferably coated with 0.05 mils of nickel over which is placed a layer of gold which is 0.03 mils thick. As will be observed in FIGS. 4A and 4B, the conductive land area 37 has "upper" and "lower" coatings $34_c$ surrounding the central substrate $34_d$ at the contact pad configuration.

The coatings $34_c$ are preferably 1 mill thick and surround the 1 mil dielectric central substrate on either side.

This provides "symmetry" to the contact pads $34_i$ and $34_e$ so that the IC pins or test probes can be inserted from either side of the access device. Thus the device is not "polarized" to limit pin insertion from one side only. There is no worry about orienting the access device into a "proper" or one side orientation.

In the preferred embodiment, the outside diameter (FIG. 4A) of the conductive land 37 is 60 mils plus or minus 2 mils, while the width of the slotted area ($34_v$, $34_h$) is 4 mils. The length of each of the slotted areas is preferably 44 mils plus or minus 2 mils.

The resiliency of the conductive land must be sufficient to form a constant pressure against the pin 24 to provide a good electrical contact. At the same time it must not be so brittle as to fracture when the pin 24 is either inserted or when the pin 24 is removed. The conductive land is designed to maintain its resiliency during usage with the insertion of the pin grid array 20.

The access device unit 30 with its conductive lands is generally used just once for test purposes and then discarded after the tests are performed. Since this flexible and convenient access unit is so relatively inexpensive, it readily solves the temporary function of permitting maintenance tests under operating conditions of the printed circuit board.

FIG. 4B illustrates the preferred embodiment of the exterior contact pad $34_e$, also called the perimeter pad. The plan view shows the preferred outside diameter of 60 mils with an inner circular aperture opening of 30 mils diameter ($34_a$ surrounded by the conductive copper layers $34_c$ which sandwich the dielectric $34_d$. The copper layer $34_c$ is provided with a cover layer of nickel which itself is covered by a thin gold layer of thickness as previously described in connection with FIG. 4A.

There has been described herein a simple, efficacious and inexpensive access device unit which makes possible the probing of and access to pins of an installed pin grid array on a printed circuit board. Thus, it is possible that testing and maintenance can easily be effectuated without recourse to the solder side of the printed circuit board which is often unavailable or difficult to locate, and also without the need for costly scratch pads which would be rendered ineffective by heat sink devices. The present access device unit for pin grid arrays makes possible the probe access of each pin of the pin grid array on an easily located and certain basis through the use of the described thin flexible film unit which is easily placed on the underside of the pin grid array when it mates to the printed circuit board.

While the access device unit has been described in its preferred embodiment, it is understood that other variations and versions of the concept may be effectuated but which may still fall within the terms of the following claims which define the subject matter of this disclosure.

What is claimed is:

1. A miniature contact pad assembly in a flexible dielectric film of 3 mil thickness having an inner area with interior contact pads for mounting under a pin grid array and an outer area having exterior contact pads, the contact pad assembly comprising, in combination:
   (a) said flexible dielectric film supporting one or more electrical inner contact pads for contacting the extended underside pins of a pin grid array, which is mounted on a printed circuit board, said dielectric film including:
   (a1) a first portion of central dielectric layer 1 mil thick having first apertures through which said extended underside pins can be thrust through, said first apertures formed of intersecting slits, each slit having a width less than the diameter of said underside pins, and wherein the area surrounding each of said apertures forms an interior contact pad which includes:
   (a1a) a first upper conductive coating 1 mil thick layer and a second lower conductive 1 mil thick coating layer, covering said central dielectric layer, wherein said dielectric film provides a contact pressure via said first or said second conductive layer against said extended underside pin after said pin is inserted into said first aperture;
   (a1b) a conductive strip extension line connecting each of said interior contact pads to individual units of identified exterior contact pads which reside on said dielectric film at a distance from said inner contact pads;
   (a2) a second portion of central dielectric layer 1 mil thick having second circular apertures forming said exterior contact pads wherein each said exterior pad includes:
   (a2a) a first upper conductive 1 mil thick coating layer and a second lower conductive coating 1 mil thick layer covering said central dielectric layer around said second circular apertures.

2. The assembly of claim 1, wherein each of said first apertures is formed of first and second slits which intersect at right angles to each other.

3. The assembly of claim 1, wherein said central dielectric layer is made of polyimide.

4. The assembly of claim 1, wherein each of said first and second 1 mil conductive layers are are coated with 0.05 mil of nickel-coated copper overlayed with gold of 0.03 mil thickness.

5. The assembly of claim 2, wherein each of said first and second slits provide longitudinal apertures having a width of 4 mils.

6. The assembly of claim 5, wherein the area surrounding said first and second slits forms a circular conductive surface having a diameter of 60 mils.

7. A flexible dielectric polyimide film access device unit with miniature contact pads for enabling electrical non-solder probe contact with each individual pin on the underside of an installed pin grid array connected to a printed circuit board, said pin grid array having extending underside pins, said device unit comprising:
   (a) a flexible dielectric film of 3 mils thickness having an interior area for residing under the surface of said pin grid array, and an exterior area which extends beyond the under-surface of said pin grid array;
   (b) a plurality of electrical interior contact pads located on said interior area to align with each individual pin of said pin grid array, each of said interior contact pads including:
   (b1) a central aperture for receiving said extending pins of said pin grid array said central aperture having first and second slits intersecting at right angles wherein each slit has a width which is less than the diameter of said underside pins;
   (b2) a contact area of said dielectric film having a 1 mil thickness and surrounding said central aperture and providing a central layer of dielectric material covered by a first upper and a second lower conductive layer of 1 mil thickness;
   (c) a plurality of electrical exterior contact pads located on said exterior area, with explicit identification indicia, each of said exterior contact pads being electrically connected to a corresponding one of said interior contact pads.

8. (Amended) The access device unit of claim 7 wherein each of said first upper and second lower conductive layers are formed of a 1 mil thick copper layer overlayed by 0.05 mils of nickel which is overlayed by 0.03 mils of gold coating.

* * * * *